United States Patent
Lim et al.

(10) Patent No.: US 11,195,591 B2
(45) Date of Patent: Dec. 7, 2021

(54) SHIFT REGISTER AND DISPLAY DEVICE INCLUDING THE SAME

(71) Applicant: LG Display Co., Ltd., Seoul (KR)

(72) Inventors: Jinho Lim, Goyang-si (KR); Jonghyun Yang, Jinju-si (KR); Saerom Lee, Iksan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 178 days.

(21) Appl. No.: 16/235,560

(22) Filed: Dec. 28, 2018

(65) Prior Publication Data
US 2019/0206502 A1  Jul. 4, 2019

(30) Foreign Application Priority Data

Dec. 28, 2017  (KR) .......................... 10-2017-0181901

(51) Int. Cl.
*G11C 19/00* (2006.01)
*G11C 19/28* (2006.01)
*G09G 3/20* (2006.01)
*G09G 3/36* (2006.01)

(52) U.S. Cl.
CPC ............. *G11C 19/28* (2013.01); *G09G 3/20* (2013.01); *G09G 3/3677* (2013.01); *G11C 19/287* (2013.01); *G09G 2300/0408* (2013.01); *G09G 2300/0426* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 8,731,136 B2* | 5/2014 | Shin | ...................... | G11C 19/28 377/64 |
| 8,878,765 B2* | 11/2014 | Shin | ...................... | G09G 3/20 345/100 |
| 10,262,609 B2* | 4/2019 | Dai | ...................... | G09G 3/3648 |
| 2007/0248204 A1* | 10/2007 | Tobita | ................... | G11C 19/28 377/64 |
| 2007/0274433 A1* | 11/2007 | Tobita | ................. | G09G 3/3677 377/64 |

(Continued)

FOREIGN PATENT DOCUMENTS

| KR | 10-2017-0079769 A | 7/2017 |
|---|---|---|
| KR | 10-1768541 B1 | 8/2017 |

*Primary Examiner* — Tuan T Lam
(74) *Attorney, Agent, or Firm* — Seed IP Law Group LLP (57) ABSTRACT

The present disclosure provides a shift register, the register including n stages, each being configured for performing forward and reverse operations, wherein in the forward operation, a gate signal is output in a forward direction, wherein in the reverse operation, a gate signal is output in a reverse direction, wherein a n-th stage among the n stages includes: a charging unit configured for charging a Q node in a response to a reception of a forward start signal or a reverse start signal; a gate signal output unit configured for outputting a gate signal in a response to the Q node being charged by the charging unit; and a discharging unit configured for discharging the Q node after the output unit has outputted the gate signal, wherein the charging unit includes a dummy transistor and a reverse start transistor, both being connected to the Q node.

14 Claims, 9 Drawing Sheets

(56) References Cited

U.S. PATENT DOCUMENTS

| | | | |
|---|---|---|---|
| 2009/0167668 A1* | 7/2009 | Kim | G09G 3/3677 345/100 |
| 2011/0157124 A1* | 6/2011 | Jung | G11C 19/28 345/211 |
| 2012/0269316 A1* | 10/2012 | Jang | G11C 19/00 377/75 |
| 2015/0002504 A1* | 1/2015 | Jo | G09G 3/3677 345/213 |
| 2015/0364078 A1* | 12/2015 | Shim | G09G 3/2092 345/211 |
| 2016/0086562 A1* | 3/2016 | Tan | G09G 3/3677 345/215 |
| 2016/0293092 A1* | 10/2016 | Li | G09G 3/2092 |
| 2016/0365054 A1* | 12/2016 | Wu | G09G 3/3677 |
| 2017/0092172 A1* | 3/2017 | Wang | G11C 19/00 |
| 2019/0147820 A1* | 5/2019 | Tsai | G11C 19/28 345/208 |
| 2019/0164515 A1* | 5/2019 | Gong | G09G 3/20 |

* cited by examiner

SHIFT REGISTER AND DISPLAY DEVICE INCLUDING THE SAME

CROSS-REFERENCE TO RELATED APPLICATIONS

This application claims the priority of Korean Patent Application No. 10-2017-0181901 filed on Dec. 28, 2017, in the Korean Intellectual Property Office, the disclosure of which is hereby incorporated by reference in its entirety.

BACKGROUND

Technical Field

The present disclosure relates to a shift register and a display device including the same.

Description of the Related Art

As the information society develops, a demand for display devices for image display in various forms is increasing. Recently, various display devices such as liquid crystal display (LCD) devices, plasma display panel (PDP) devices, and organic light emitting diode (OLED) display devices have been used.

Some of the display devices as described above, for example, the liquid crystal display device or the organic light emitting diode display device, include a display panel including a plurality of pixels arranged in a matrix form, a drive unit for driving the display panel, and a timing control unit for controlling the drive unit. The drive unit includes a gate drive unit for supplying a gate signal to the display panel and a data drive unit for supplying a data signal to the display panel.

Recently, a GIP (Gate-In-Panel) approach is applied in which a thin film transistor (TFT) is formed in each pixel of a display region of the display device, a gate drive unit circuit is formed in a non-display region, and, thus, the gate drive unit is built into a TFT array substrate of the display panel.

In the GIP scheme, each stage (channel) of the gate drive unit includes a plurality of transistors (TFT). A gate signal having a high potential driving voltage (VGH) level or a low potential driving voltage (VGL) level is supplied to a gate line. To this end, the gate drive unit includes a plurality of stages, each including a plurality of transistors. The gate signal is sequentially output according to an operation of each stage.

An output of each stage is connected to a pull-up transistor for outputting the high-potential driving voltage (VGH) and to a pull-down transistor for outputting the low-potential driving voltage (VGL). The transistors constituting the gate drive unit serve to supply a scan signal to a transistor in each pixel formed in the display panel. Therefore, not only basic transistor characteristics such as mobility, leakage current, etc., but also a durability thereof to maintain a long life, and electric reliability for stable operation are very important.

The above-described display device displays an image input from an outside on a frame basis. A drive period of the display device is divided into a display period in which each frame is displayed and a non-display period in which no frame is displayed. During the display period, a gate signal generated by the gate drive unit is sequentially supplied to the display panel via the gate line, such that an image corresponding to one frame is displayed on-the display panel. During the non-display period, the gate signal is not supplied via the gate line, and, thus, a black image is displayed on-the display panel. While the image is displayed on-the display device, the display period and the non-display period proceed repeatedly.

However, according to the prior art, current charged into some stages constituting the shift register included in the gate drive unit during the display period may not be fully discharged before the non-display period begins. As a result, a defect (line defect) occurs in which some display lines are activated in the non-display period.

BRIEF SUMMARY

This summary is provided to introduce a selection of concepts in a simplified form that are further described below in the Detailed Description. This summary is not intended to identify all key features or essential features of the claimed subject matter, nor is it intended to be used alone as an aid in determining the scope of the claimed subject matter.

The present disclosure has a purpose to provide a shift register and a display device including the same, in which current charged into some stages constituting the shift register included in the gate drive unit during the display period is fully discharged before the non-display period begins, and, as a result, the defect (line defect) otherwise occurring in the non-display period is suppressed.

Purposes of the present disclosure are not limited to the foregoing purposes and all benefits of the disclosed system are not described herein. Other purposes and advantages of the present disclosure which are not mentioned above may be understood from following descriptions and understood more clearly from embodiments of the present disclosure. It will also be readily apparent to the skilled person that purposes and advantages of the present disclosure may be embodied by means of features and combinations thereof set forth in the claims.

In a first aspect of the present disclosure, there is provided a shift register, the register including n stages, each being configured for performing forward and reverse operations, wherein in the forward operation, a gate signal is output in a forward direction, wherein in the reverse operation, a gate signal is output in a reverse direction, wherein a n-th stage among the n stages includes: a charging unit configured for charging a Q node in a response to a reception of a forward start signal or a reverse start signal; a gate signal output unit configured for outputting a gate signal in a response to the Q node being charged by the charging unit; and a discharging unit configured for discharging the Q node after the output unit has outputted the gate signal, wherein the charging unit includes a dummy transistor and a reverse start transistor, both being connected to the Q node.

In one embodiment of the first aspect, the dummy transistor is turned on after the gate signal has been outputted by the output unit in the forward operation.

In one embodiment of the first aspect, the dummy transistor is configured to discharge the Q node after the gate signal has been outputted by the output unit in the forward operation.

In one embodiment of the first aspect, the reverse start transistor is turned on by the reverse start signal in the reverse operation.

In one embodiment of the first aspect, the dummy transistor is turned on only in the forward operation, wherein the reverse start transistor is turned on only in the reverse operation.

In a second aspect of the present disclosure, there is provided a display device comprising: a display panel having a plurality of pixels; a gate drive unit configured for supplying a gate signal to a plurality of gate lines arranged in the display panel; a data drive unit configured for supplying a data signal to a plurality of data lines arranged in the display panel; and a timing control unit configured for controlling the gate drive unit and the data drive unit, wherein the gate drive unit includes a shift register, the register including n stages, each being configured for performing forward and reverse operations, wherein in the forward operation, a gate signal is output in a forward direction, wherein in the reverse operation, a gate signal is output in a reverse direction, wherein a n-th stage among the n stages includes: a charging unit configured for charging a Q node in a response to a reception of a forward start signal or a reverse start signal; a gate signal output unit configured for outputting a gate signal in a response to the Q node being charged by the charging unit; and a discharging unit configured for discharging the Q node after the output unit has outputted the gate signal, wherein the charging unit includes a dummy transistor and a reverse start transistor, both being connected to the Q node.

In one embodiment of the second aspect, the dummy transistor is turned on after the gate signal has been outputted by the output unit in the forward operation.

In one embodiment of the second aspect, the dummy transistor is configured to discharge the Q node after the gate signal has been outputted by the output unit in the forward operation.

In one embodiment of the second aspect, the reverse start transistor is turned on by the reverse start signal in the reverse operation.

In one embodiment of the second aspect, the dummy transistor is turned on only in the forward operation, wherein the reverse start transistor is turned on only in the reverse operation.

In accordance with the present disclosure, the current charged into some stages constituting the shift register included in the gate drive unit during the display period is fully discharged before the non-display period begins. As a result, the defect (line defect) otherwise occurring in the non-display period is suppressed.

DETAILED DESCRIPTION

The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
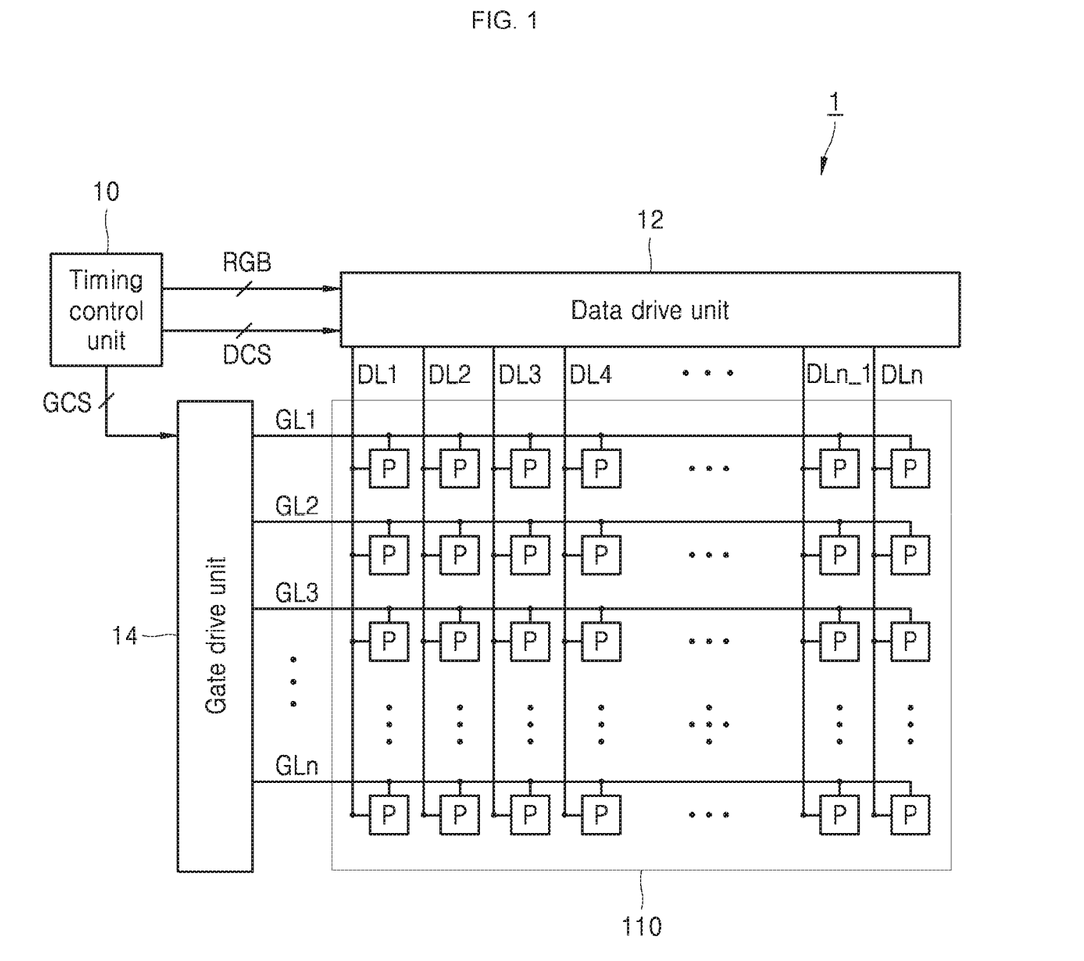
FIG. 1 is a block diagram of a display device according to one embodiment of the present disclosure.

FIG. 1 is a block diagram of a display device according to one embodiment of the present disclosure.

Referring to FIG. 1, a display device 1 according to an embodiment of the present disclosure includes a display panel 110.

The display panel 110 includes a plurality of data lines DL1 to DLn and a plurality of gate lines GL1 to GLn. The plurality of data lines DL1 to DLn and plurality of gate lines GL1 to GLn cross each other to define a pixel region.

When a specific gate line is opened, a data drive unit 12 converts image data RGB received from a timing control unit 10 into an analog based data voltage and supplies the converted voltage to each data line DL1 to DLn. The data drive unit 12 operates based on a data control signal DCS provided from the timing control unit 10.

The data drive unit 12 may include at least one source driver integrated circuit. Each source driver integrated circuit may be connected to a bonding pad of the display panel 110 using TAB (Tape Automated Bonding) or COG (Chip On Glass) or may be connected directly to the display panel 110. Alternatively, the integrated circuit may be integrated in the display panel 110.

Alternatively, each source driver integrated circuit may be implemented in a COF (Chip On Film) manner. In this case, one end of each source driver integrated circuit is bonded to at least one source printed circuit board, while the other end of the integrated circuit is bonded to the display panel 110.

The gate drive unit 14 generates gate signals and sequentially supplies the generated signals to the respective gate lines GL1 to GLn. The gate drive unit 14 operates based on a gate control signal GCS provided from the timing control unit 10. The gate drive unit 14 includes a shift register including a plurality of stages, as described below.

The gate drive unit 14 may include at least one gate driver integrated circuit. Each gate driver integrated circuit may be connected to a bonding pad of the display panel 110 using TAB (Tape Automated Bonding) or COG (Chip On Glass). Alternatively, in the GIP (Gate In Panel), the gate driver integrated circuit may be disposed directly in the display panel 110. Alternatively, the gate driver integrated circuit may be integrated in the display panel 110. Alternatively, each gate driver integrated circuit may be implemented in a COF (Chip On Film) manner in which each gate driver integrated circuit is mounted on a film connected to the display panel 110.

The timing control unit 10 adapts the image data RGB input from an external source to the size and the resolution of the display panel 110 and supplies the adapted data to the data drive unit 12. The timing control unit 10 generates a data control signal DCS and a gate control signal GCS using synchronization signals input from an external source, such as a dot clock DCLK, a data enable signal DE, a horizontal synchronization signal Hsync, a vertical synchronization signal Vsync, etc. The unit 10 supplies the generated data control signal DCS and gate control signal GCS to the data drive unit 12 and the gate drive unit 14, respectively.

The data control signal DCS includes a source start signal, a source sampling clock, a polarity control signal, and a source output enable signal. The source start signal controls a shift start timing of the data drive unit 12. The source sampling clock refers to a clock signal that controls sampling timing of data in the data drive unit 12 based on a rising edge or a falling edge. The polarity control signal controls a polarity of a data voltage output from the data drive unit 12.

The gate control signal GCS includes a start signal, a clock signal CLK1 to CLK4, and a gate output enable signal, etc. The start signal includes a forward start signal and a reverse start signal that are fed through the same input line. The start signal is input to the shift register to control a shift start timing. The clock signals CLK1 to CLK4 are level-shifted via a level shifter (not shown) and then input to a shift register, in which the level-shifted clock signals are used as clock signals to shift the start signal. The gate output enable signal controls an output timing of the shift register.

The timing control unit 10 may be disposed in a control printed circuit board. The control printed circuit board is connected via a connection medium such as an FFC (flexible flat cable) or an FPC (flexible printed circuit) to the source printed circuit board having the source driver integrated circuit bonded thereto.

Figure 2:
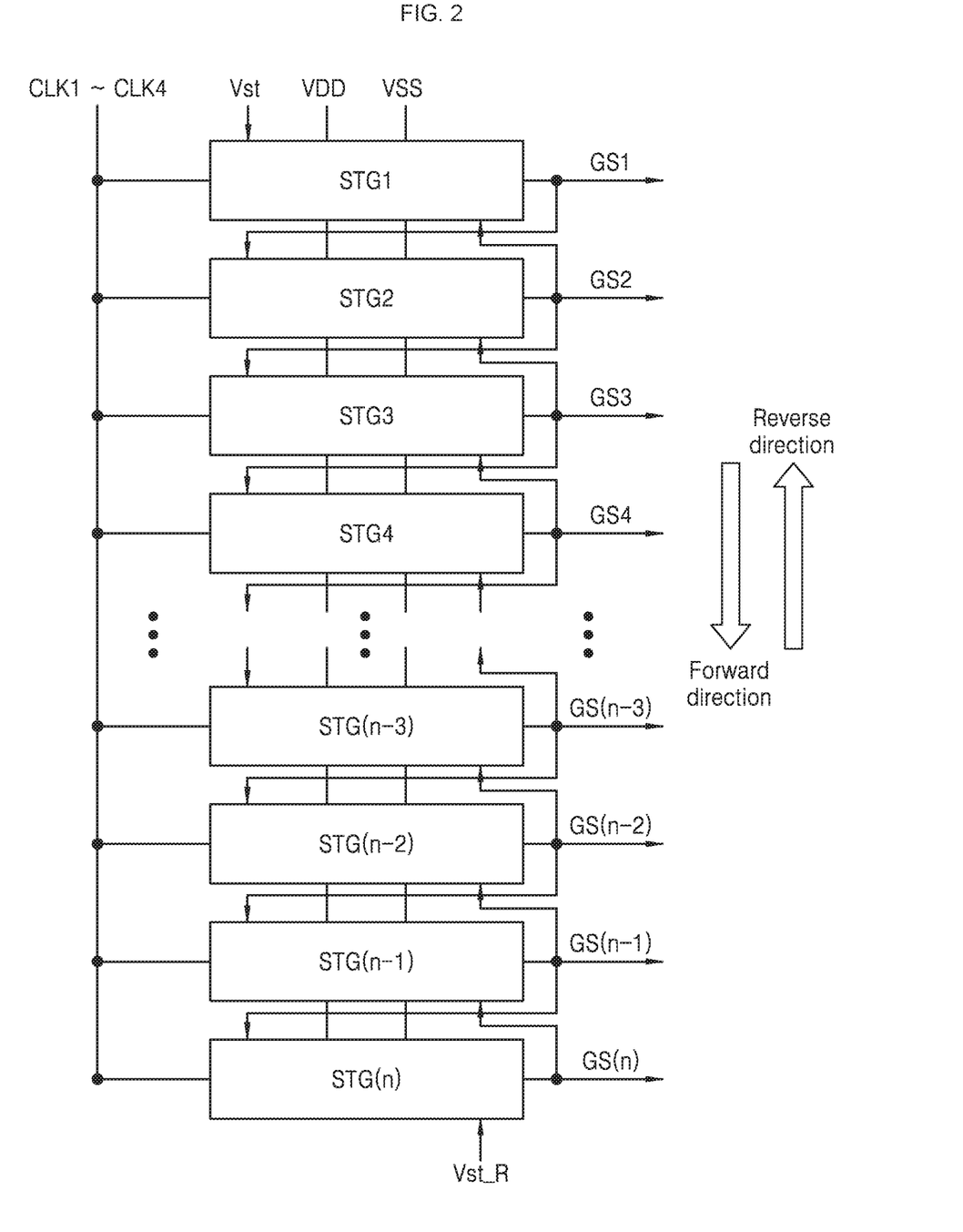
FIG. 2 shows a block diagram of a shift register included in a gate drive unit according to one embodiment of the present disclosure.

FIG. 2 shows a configuration of a shift register included in the gate drive unit according to one embodiment of the present disclosure.

Referring to FIG. 2, a shift register according to an embodiment of the present disclosure has a plurality of stages STG(1) to STG(n) that are connected in a cascaded manner. The shift register outputs gate signals GS(1) to GS(n) whose phases are shifted by a predetermined time. Each gate signal GS(1) to GS(n) is sequentially applied to a corresponding gate line and serves as a carry signal to be transferred to a subsequent stage.

In this connection, positions of the previous stage and the subsequent stage depend on an operation direction of the shift register. When the shift register shown in FIG. 2 is operated in a forward direction, that is, when the shift register sequentially outputs gate signals in the order from the stage STG(1) to the stage STG(n), the previous stage refers to a stage arranged upwardly adjacent to a current stage, while the subsequent stage refers to a stage arranged downwardly adjacent to the current stage.

On the other hand, when the shift register shown in FIG. 2 is operated in a reverse direction, that is, when the shift register sequentially outputs gate signals in the order from the stage STG(n) to the stage STG(1), the previous stage refers to a stage arranged downwardly adjacent to a current stage, while the subsequent stage refers to a stage arranged upwardly adjacent to the current stage.

In the forward operation, the first stage STG(1) is driven in response to a forward start pulse Vst input from the timing control unit 10. Further, the second to n-th stages STG(2) to STG(n) respectively receive forward carry signals input from the first to (n−1)-th stages STG(1) to STG(n−1) as start pulses, and are respectively driven in a response to the received signals.

In the reverse operation, the n-th stage STG(n) is driven in response to a reverse start pulse Vst_R input from the timing control unit 10. Further, the (n−1)-th to the first stages STG(n−1) to STG(1) respectively receive reverse carry signals input from the n-th to second stages STG(n) to STG(2) as start pulses, and are respectively driven in a response to the received signals.

Each stage STG(1) to STG(n) receives a first DC drive voltage VDD having a turn-on level and a second DC drive voltage VSS having a turn-off level.

Further, each of the stages STG(1) to STG(n) receives j (j being a positive odd number) clock signals among i (i being a positive even number, j being smaller than i) clock signals, in which the i clock signals have respective phases which are phased-delayed from one another by a phase difference of a predetermined time. Hereinafter, it is exemplified that four clock signals having sequentially delayed phases every one horizontal period are sequentially input to each stage STG(1) to STG(n). However, the present disclosure is not limited thereto. According to embodiments, the number of clock signals input to each stage STG(1) to STG(n) may vary.

In accordance with the present disclosure, the n-th stage STG(n) among the plurality of stages STG(1) to STG(n) constituting the shift register according to an embodiment of the present disclosure has a different circuit configuration from those of the first to (n−1)-th stages STG(1) to STG(n−1). Hereinafter, referring to FIG. 3 to FIG. 9, circuit configurations of the plurality of stages STG(1) to STG(n) constituting the shift register according to an embodiment of the present disclosure, and charge/discharge operations thereof will be described in detail.

Figure 3:
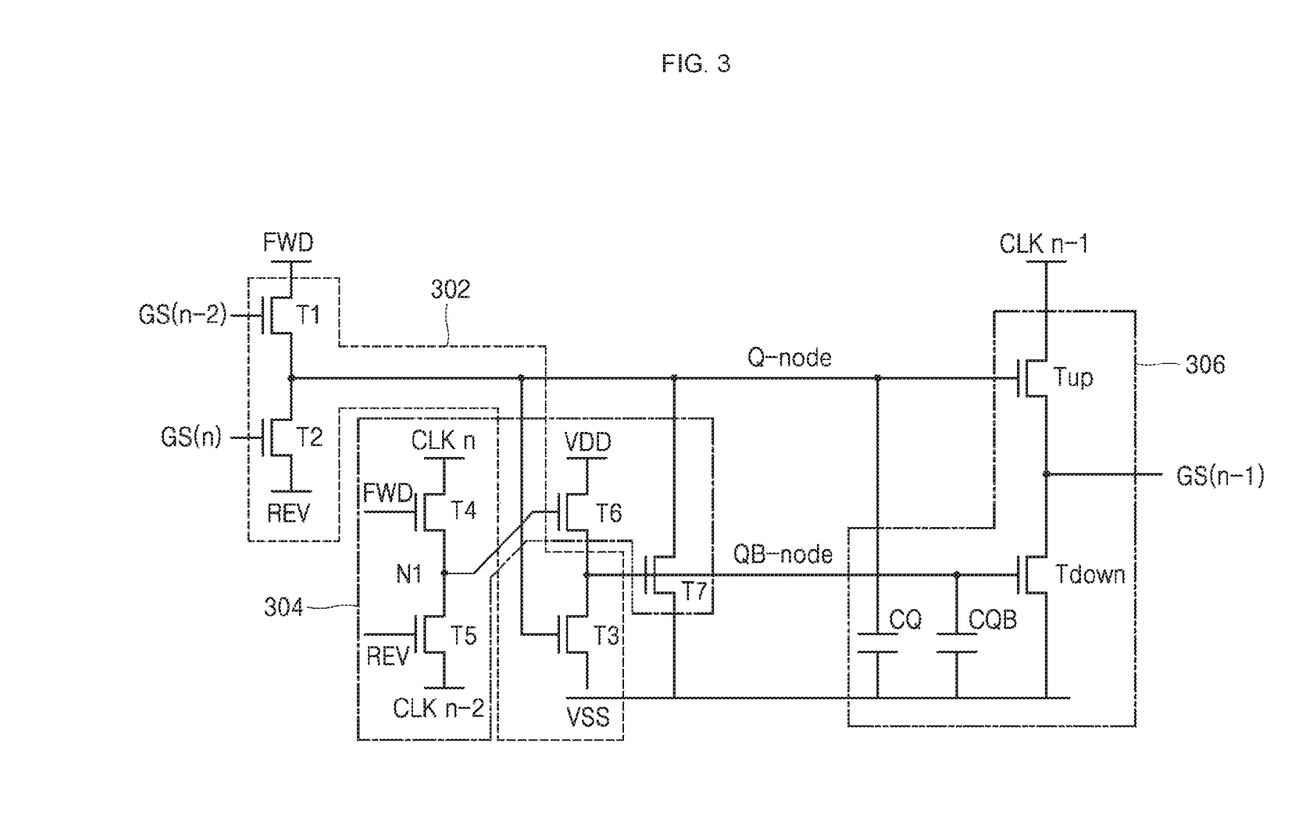
FIG. 3 is a circuit diagram of a (n−1)-th stage of a shift register according to one embodiment of the present disclosure.

FIG. 3 is a circuit diagram of the (n−1)-th stage of the shift register according to one embodiment of the present disclosure. Although FIG. 3 shows the circuit diagram of the (n−1)-th stage STG(n−1), each of the first stage to (n−2)-th stages STG(1) to STG(n−2) may have the same circuit configuration as that of the (n−1)-th stage STG(n−1). Therefore, descriptions of circuit configurations of the first to (n−2)-th stages STG(1) to STG(n−2) is omitted.

Referring to FIG. 3, the (n−1)-th stage STG(n−1) constituting the shift register according to an embodiment of the present disclosure includes a charging unit 302, a discharging unit 304, and a gate signal output unit 306.

The charging unit 302 is driven in response to a reception of a forward carry signal GS(n−2) or a reverse carry signal GS(n) input from a previous stage, to charge a Q-node to have a voltage having a specific level. The charging unit 302 includes a first transistor T1, a second transistor T2, and a third transistor T3.

A gate of the first transistor T1 is fed with the forward carry signal GS(n−2) while a source thereof is fed with a forward voltage FWD. Further, a gate of the second transistor T2 is supplied with a reverse carry signal GS(n), while a drain thereof is supplied with a reverse voltage REV. The Q node is connected to a joint point between a drain of the first transistor T1 and a source of the second transistor T2.

Further, a gate of the third transistor T3 is connected to the Q node, while a source thereof is connected to a drain of the sixth transistor T6. The drain of the transistor T3 is connected to a second DC drive voltage VSS.

After the gate signal output unit 306 has outputted the gate signal GS(n−1) via the Q node charging operation by the charging unit 302, the discharging unit 304 is driven to discharge the voltage charged in the Q node. The discharging unit 304 includes a fourth transistor T4, a fifth transistor T5, a sixth transistor T6, and a seventh transistor T7.

A gate of the fourth transistor T4 is supplied with a forward voltage FWD while a source thereof is supplied with an n-th clock signal CLK n. A gate of the fifth transistor T5 is supplied with the reverse voltage REV while a drain thereof is supplied with a (n−2)-th clock signal CLK n−2. A joint point N1 between a drain of the fourth transistor T4 and a source of the fifth transistor T5 is connected to a gate of the sixth transistor T6.

A source of the sixth transistor T6 is supplied with a first DC drive voltage VDD, while a drain thereof is connected to a source of the third transistor T3.

A source of the seventh transistor T7 is connected to the Q node, while the drain thereof is connected to a second DC drive voltage VSS. Further, a gate of the seventh transistor T7 is connected to a joint point between a drain of the sixth transistor T6 and a source of the third transistor T3.

The gate signal output unit 306 is driven in response to the Q node charging operation by the charging unit 302, to output the gate signal GS(n−1). The gate signal output unit 306 includes a pull-up transistor Tup, a pull-down transistor Tdown, a Q node capacitor CQ, and a QB node capacitor CQB.

A gate of the pull-up transistor Tup is connected to the Q node, while a source thereof is supplied with a (n−1)-th clock signal CLK n−1. A gate of the pull-down transistor Tdown is connected to the QB node, while a drain thereof is connected to the second DC drive voltage VSS. A drain of the pull-up transistor Tup and a source of the pull-down transistor Tdown are connected with each other to produce a gate signal output point.

As mentioned above, each of the first stage to (n−2)-th stages STG(1) to STG(n−2) may have the same circuit configuration as that of the (n−1)-th stage STG(n−1). However, a forward start signal Vst instead of the forward carry signal GS(n−2) is applied to the gate of the first transistor T1 constituting the first stage STG(1).

Figure 4:
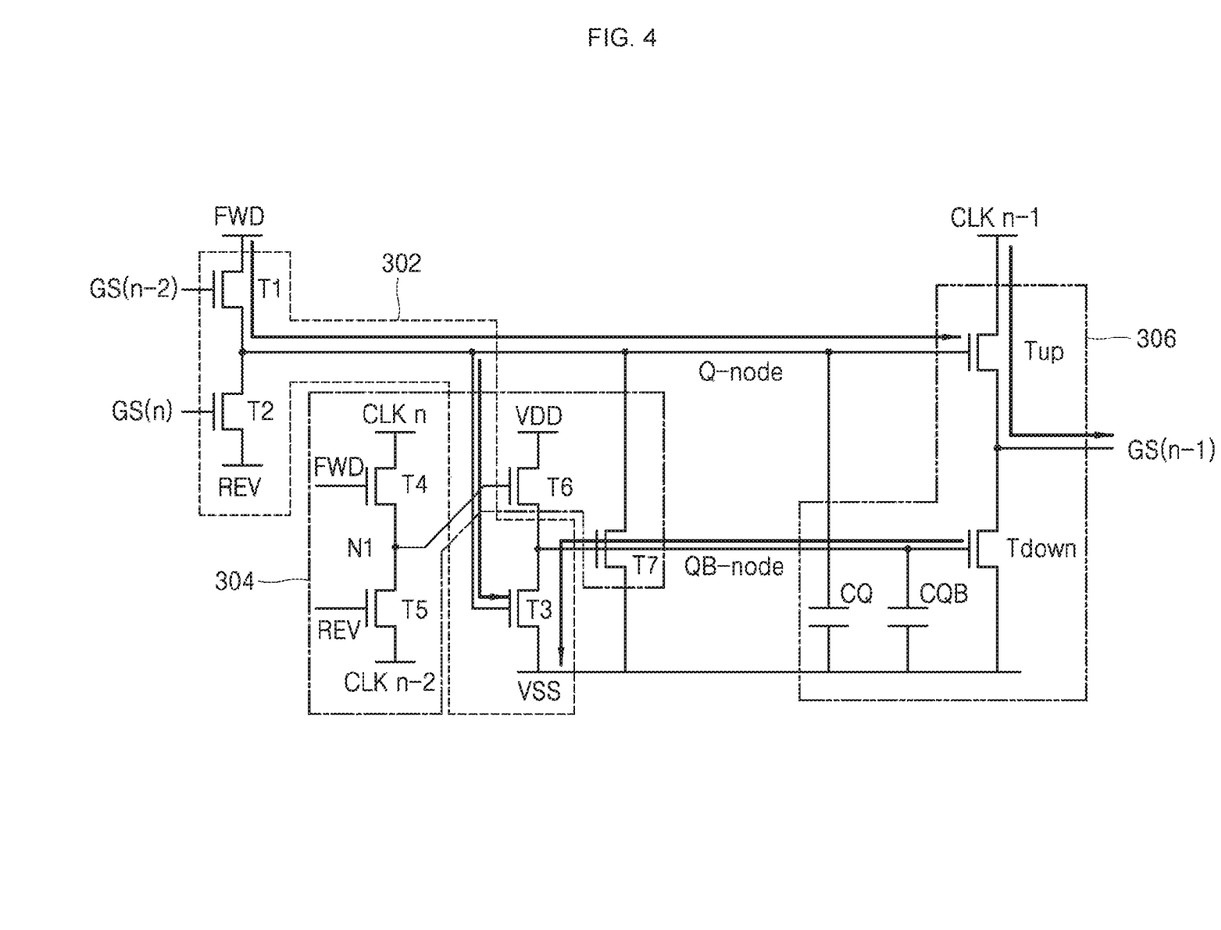
FIG. 4 shows a process for charging a Q node in the (n−1)-th stage in a forward operation of a shift register according to one embodiment of the present disclosure.

FIG. 4 shows a process for charging the Q node in the (n−1)-th stage in a forward operation of a shift register according to one embodiment of the present disclosure.

The Q node charging operation by the charging unit 302 starts in response to receipt of the forward carry signal GS(n−2). The forward carry signal GS (n−2) output from the previous stage STG (n−2) is input to the gate of the first transistor T1 of the charging unit 302, to turn on the first transistor T1.

When the first transistor T1 is turned on, the forward voltage FWD is supplied to the Q node through the source of the first transistor T1. The forward voltage FWD supplied to the Q node turns on the third transistor T3. When the third transistor T3 is turned on, a current path from the QB node toward the second DC drive voltage VSS is generated, such that the QB node is discharged.

Further, the forward voltage FWD supplied to the Q node is supplied to the gate of the pull-up transistor Tup included in the gate signal output unit 306. At this time, when the (n−1)-th clock signal CLK n−1 is supplied to the source of the pull-up transistor Tup, a potential of the Q node is boosted by the Q node capacitor CQ, and, thus becomes higher to the turn-on level. As a result, the pull-up transistor Tup is turned on, and, thus, the (n−1)-th clock signal CLK n−1 is output as the (n−1)-th gate signal GS(n−1).

Figure 5:
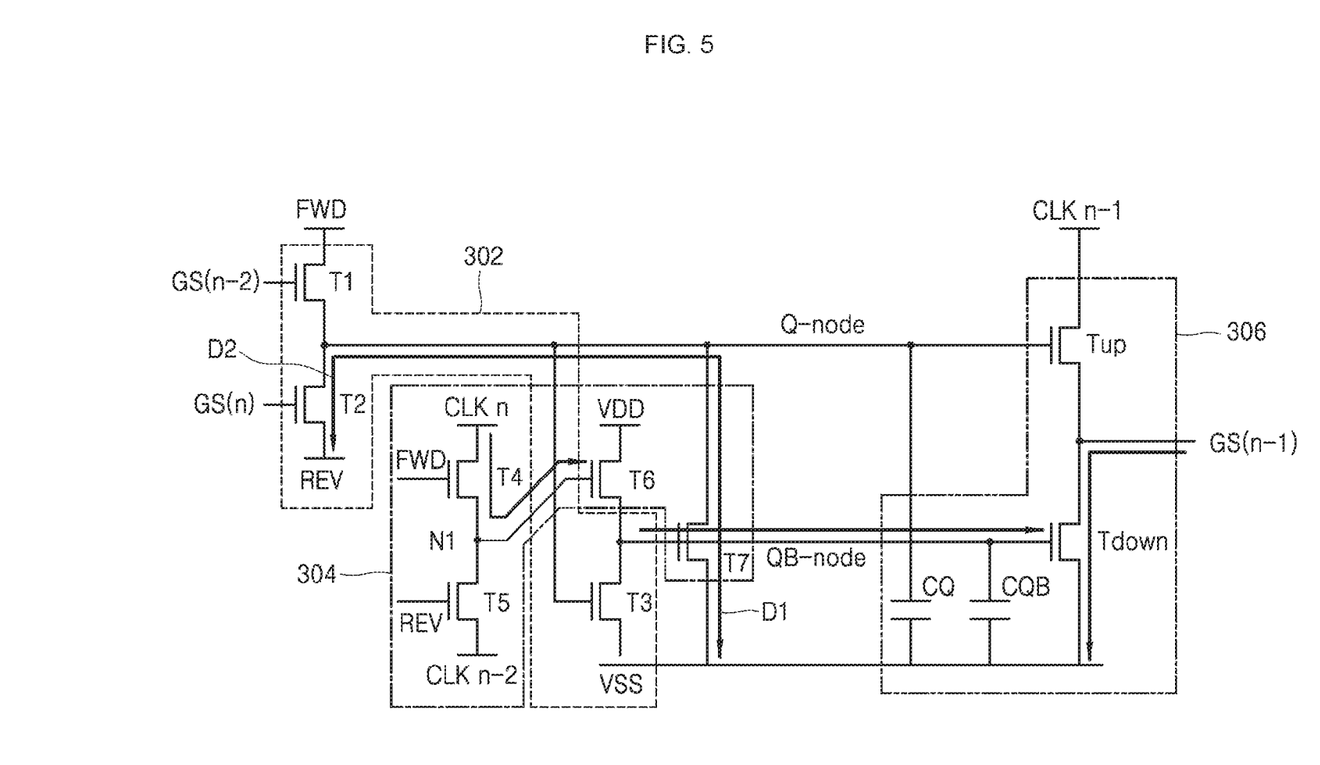
FIG. 5 shows a process for discharging the Q node in the (n−1)-th stage in a forward operation of a shift register according to one embodiment of the present disclosure.

FIG. 5 shows a process for discharging the Q node in the (n−1)-th stage in a forward operation of a shift register according to one embodiment of the present disclosure.

When the (n−1)-th gate signal GS(n−1) is output via the charging operation as illustrated in FIG. 4, the Q node discharge operation by discharging unit 304 is started. As the fourth transistor T4 is turned on by the forward voltage FWD, the discharging operation by the discharging unit 304 starts.

When the fourth transistor T4 is turned on, the n-th clock signal CLK n is supplied via the source of the fourth transistor. The n-th clock signal CLK n supplied via the fourth transistor T4 is input to the gate of the sixth transistor T6, to turn on the sixth transistor T6. Accordingly, the first DC drive voltage VDD is supplied to the QB node via the sixth transistor T6.

The first DC drive voltage VDD supplied to the QB node is supplied to the gate of the pull-down transistor Tdown. Thus, the pull-down transistor Tdown is turned on. As the pull-down transistor Tdown is turned on, a current path is generated from the gate signal output point between the drain of the pull-up transistor Tup and the source of the pull-down transistor Tdown toward the second DC drive voltage VSS. Accordingly, the voltage is discharged from the gate signal output point.

Further, the first DC drive voltage VDD supplied through the sixth transistor T6 turns on the seventh transistor T7. Accordingly, the voltage charged in the Q node is discharged through the seventh transistor T7 (D1).

Further, upon receiving the (n−1)-th gate signal GS, a subsequent stage, i.e., the n-th stage STG(n) outputs a gate signal GS(n). The output gate signal is input to the gate of the second transistor T2. Therefore, when the second transistor T2 is turned on, the voltage charged in the Q-node is discharged through the second transistor T2 (D2).

Each of the first to (n−1)-th stages STG(1) to STG(n−1) constituting the shift register according to one embodiment of the present disclosure has a circuit configuration as shown in FIG. 3 and performs the forward operation a shown in FIG. 4 and FIG. 5. On the other hand, regarding the reverse operation, during the charging operation, the n-th gate signal GS(n) is input as a reverse carry signal to the gate of the second transistor T2, and, then, during the discharge operation, the (n−2)-th gate signal GS(n−2) is input to the gate of the first transistor T1. A rest of the reverse operation is performed in the same way as described in FIG. 4 and FIG. 5.

However, when the n-th stage STG(n) constituting the shift register according to an embodiment of the present disclosure is configured as shown in FIG. 3, the defect (line defect) occurs in which some display lines are displayed in the non-display period, as described above.

When the n-th stage STG (n) is constructed as shown in FIG. 3, the gate of the second transistor T2 is fed with the reverse start signal Vst_R instead of the subsequent gate signal. However, the reverse start signal Vst_R is not applied in the current display period, but is input at a start time of a subsequent display period after the non-display period ends.

When the reverse start signal Vst_R is not inputted in the current display period, the second transistor T2 cannot be turned on in the discharge operation process by the discharging unit 304 as described above with reference to FIG. 5. As a result, among the two discharge paths D1 and D2 for discharging the voltage charged in the Q node, the second discharge path D2 is not generated.

When the second discharge path D2 is not generated in the n-th stage STG(n) at the end of the current display period, the charges charged in the Q node are not completely discharged. As a result, the n-th gate signal GS(n) is output from the n-th stage STG(n) during the non-display period due to the charges remaining in the Q node. Thus, pixels on the n-th gate line Gn to which the n-th gate signal GS(n) is supplied may be enabled. In this way, as described above, a line defect appears in the non-display period.

According to the present disclosure, an internal circuit of the n-th stage STG(n) is configured differently from the internal circuit of each of the remaining stages in order to suppress the line defect during the non-display period. Hereinafter, the circuit configuration of the n-th stage STG (n) constituting the shift register according to an embodiment of the present disclosure and a gate signal output process thereof will be described in detail.

Figure 6:
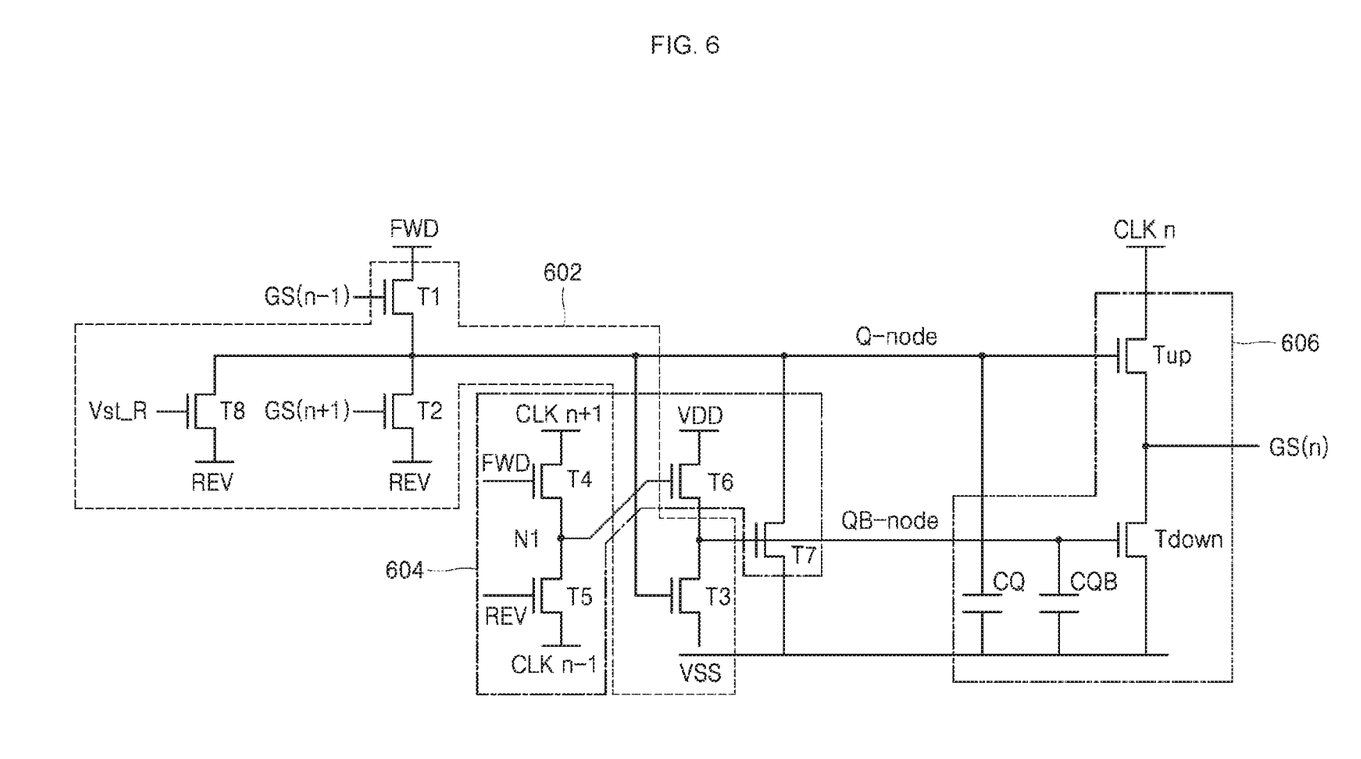
FIG. 6 is a circuit diagram of a n-th stage of a shift register according to one embodiment of the present disclosure.

FIG. 6 is a circuit diagram of the n-th stage that constitutes the shift register according to one embodiment of the present disclosure.

Referring to FIG. 6, the n-th stage STG(n) constituting the shift register according to an embodiment of the present disclosure includes a charging unit 602, a discharging unit 604, and a gate signal output unit 606.

A configuration of each of the discharging unit 604 and the gate signal output unit 606 of the n-th stage STG(n) as shown in FIG. 6 is similar to that of each of the discharging unit 304 and gate signal output unit 306 in the (n−1)-th stage STG(n−1). Therefore, in the following, a configuration of the charging unit 602 is mainly described.

The charging unit 602 is driven in response to receipt of a forward carry signal GS (n−1) input from a previous stage or a reverse start signal Vst_R input from the timing control unit 10, thereby to charge the Q node to have a voltage with a predetermined level. The charging unit 602 includes a first transistor T1, a dummy transistor T2, a third transistor T3, and a reverse start transistor T8.

A gate of the first transistor T1 receives a forward carry signal GS(n−1) output from a previous stage STG(n−1) while a source of the first transistor T1 is supplied with a forward voltage FWD. Further, a dummy carry signal GS(n+1) is input to a gate of the dummy transistor T2, while a reverse voltage REV is supplied to a drain thereof. A Q node is connected to a joint point between a drain of the first transistor T1 and a source of the second transistor T2. As described later, the dummy transistor T2 is turned on only when the shift register is operated in the forward direction and only during a discharge operation of the Q node.

Though not shown in FIG. 2, a dummy stage (not shown) for outputting the dummy carry signal GS(n+1) as input to the gate of the dummy transistor T2 may be arranged at a subsequent position of the n-th stage STG(n). Depending on embodiments, the dummy carry signal GS(n+1) may be output from the timing control unit 10 instead of the dummy stage.

The reverse start signal Vst output from the timing control unit 10 is input to a gate of the reverse start transistor T8 while a source of the transistor T8 is connected to the Q node Q-node. The reverse voltage REV is supplied to a drain of the transistor T8. As described below, the reverse start transistor T8 is turned on only when the shift register is operated in a reverse manner.

Further, a gate of the third transistor T3 is connected to the Q node Q-node, a source thereof is connected to a drain of the sixth transistor T6, and a drain thereof is connected to the second DC drive voltage VSS.

As described above, the n-th stage STG(n) of the shift register according to an embodiment of the present disclosure includes the dummy transistor T2 and the reverse start transistor T8, which are not included in the remaining stages. Hereinafter, the forward operation and the reverse operation of the n-th stage STG(n) of the shift register according to an embodiment of the present disclosure will be described with reference to FIGS. 7 to 9.

Figure 7:
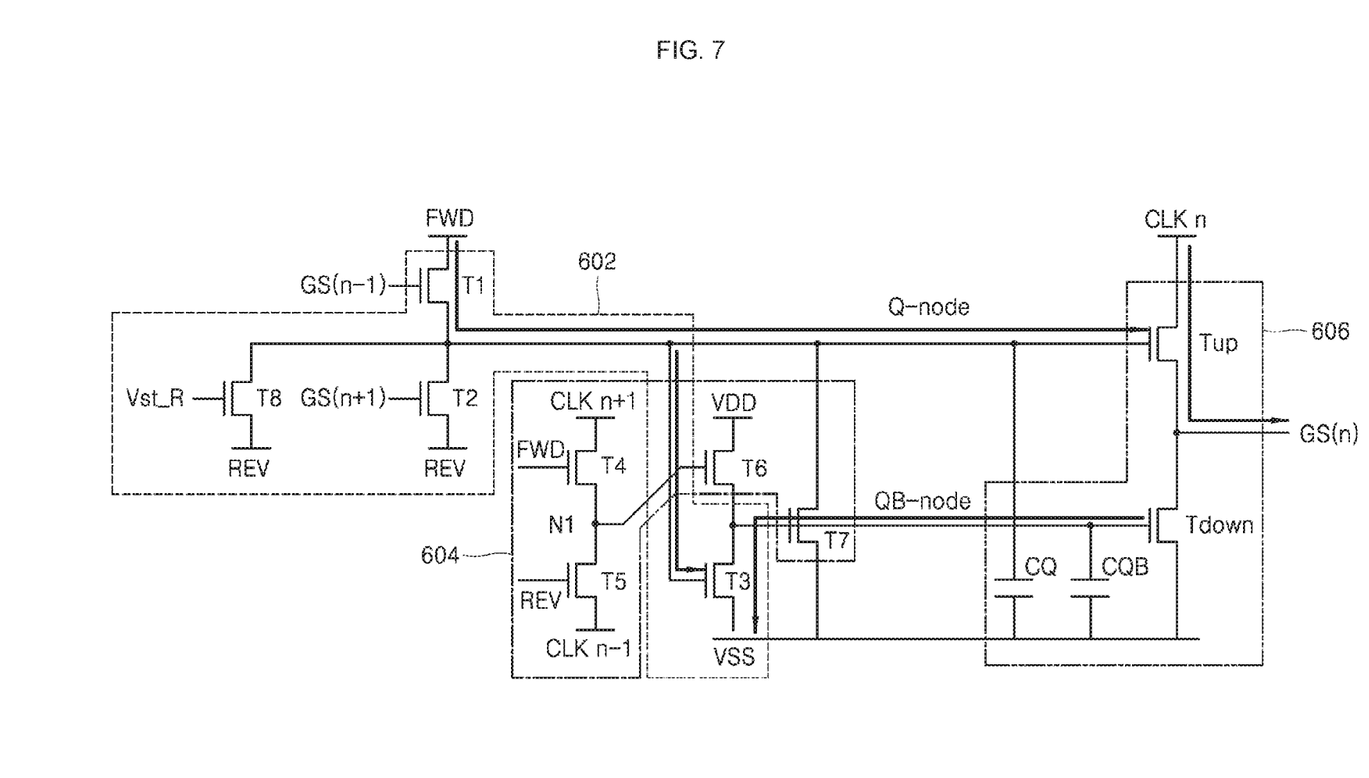
FIG. 7 shows a process for charging a Q node in the n-th stage in a forward operation of a shift register according to one embodiment of the present disclosure.

FIG. 7 shows a process for charging a Q node in the n-th stage in a forward operation of a shift register according to one embodiment of the present disclosure.

A Q node charging operation by the charging unit 602 is initiated in response to receipt of the forward carry signal G n−1. The forward carry signal G n−1 output from the previous stage STG (n−1) is input to the gate of the first transistor T1 of the charging unit 602, to turn on the first transistor T1.

When the first transistor T1 is turned on, a forward voltage FWD is supplied to the Q node through the source of the first transistor T1. The forward voltage FWD supplied to the Q node turns on the third transistor T3. As the third transistor T3 is turned on, a current path from the QB node toward the second DC drive voltage VSS is generated and, hence, the QB node is discharged.

Further, the forward voltage FWD supplied to the Q node Q-node is supplied to the gate of the pull-up transistor Tup included in the gate signal output unit 306. At this time, when the n-th clock signal CLK n is supplied to the source of the pull-up transistor Tup, the potential of the Q-node is boosted by a Q-node capacitor CQ, to a higher level at a turn-on level. As a result, the pull-up transistor Tup is turned on, and, thus, the n-th clock signal CLK n is output as the n-th gate signal GS(n).

Figure 8:
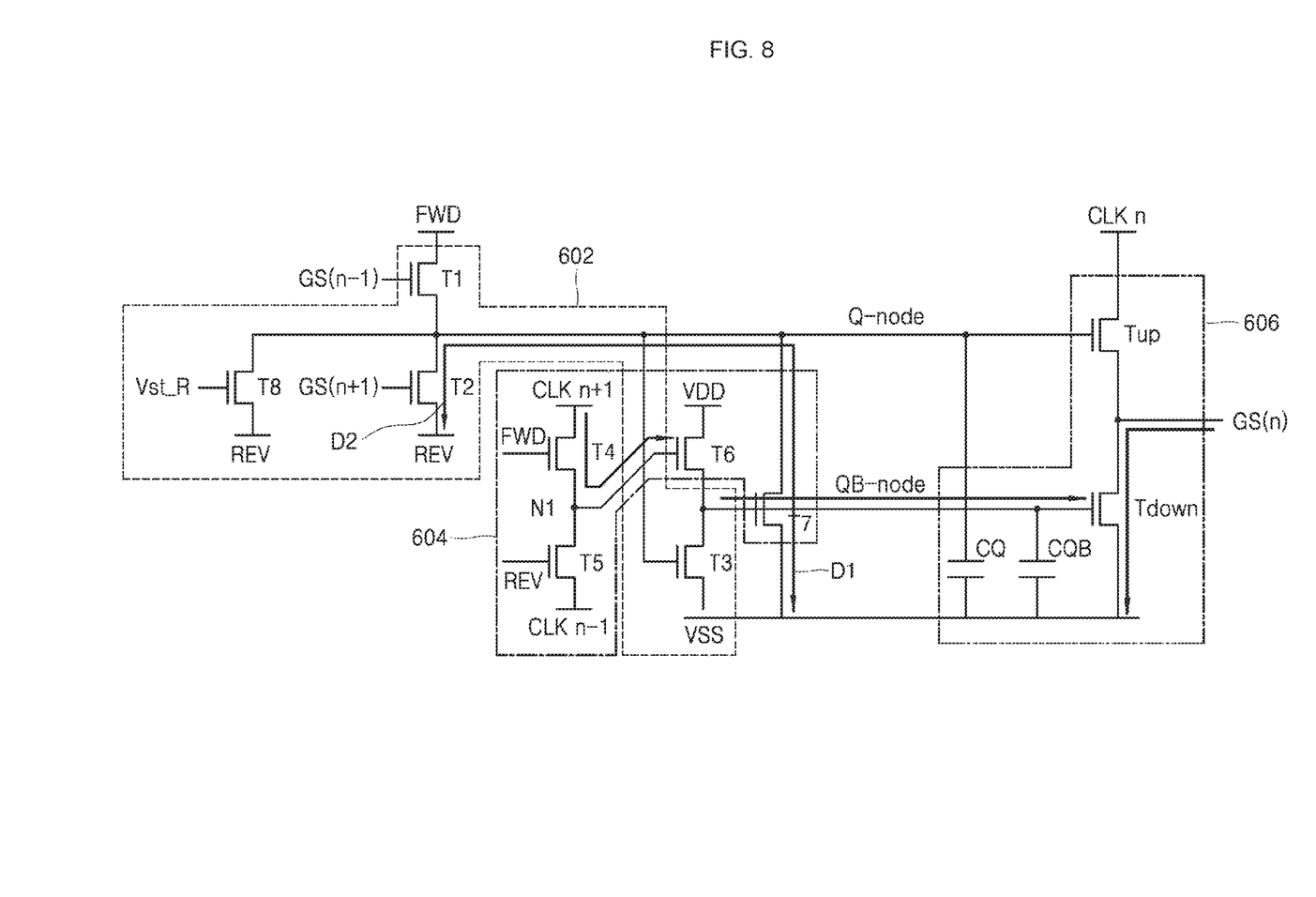
FIG. 8 shows a process for discharging the Q node in the n-th stage in a forward operation of a shift register according to one embodiment of the present disclosure.

FIG. 8 shows a process for discharging the Q node in the n-th stage in a forward operation of a shift register according to one embodiment of the present disclosure.

When the n-th gate signal GS(n) is output via the Q node charging operation by the charging unit 602, the discharging operation of the Q node Q-node by the discharging unit 604 is performed. The discharging operation by the discharging unit 604 begins when the fourth transistor T4 is turned on by the forward voltage FWD.

When the fourth transistor T4 is turned on, a (n+1)-th clock signal CLK n+1 is supplied through the source of the fourth transistor. The (n+1)-th clock signal CLK n+1 supplied through the fourth transistor T4 is input to the gate of the sixth transistor T6, to turn on the sixth transistor T6. Accordingly, the first DC drive voltage VDD is supplied to the QB node through the sixth transistor T6.

The first DC drive voltage VDD supplied to the QB-node is supplied to the gate of the pull-down transistor Tdown to turn-on the pull-down transistor Tdown. As the pull-down transistor Tdown is turned on, a current path from the gate signal output point between the drain of the pull-up transistor Tup and the source of the pull-down transistor Tdown toward the second DC drive voltage VSS is generated. Accordingly, the voltage is discharged from the gate signal output point.

Further, the seventh transistor T7 is turned on by the first DC drive voltage VDD supplied by the sixth transistor T6. Therefore, the charges charged in the Q-node are discharged through the seventh transistor T7 (D1).

Further, the dummy carry signal G(n+1) is input to the gate of the dummy transistor T2. Thus, the dummy transistor T2 is turned on. Then, the charges charged in the Q-node are discharged through the second transistor T2 (D2).

As described above, when the n-th stage STG(n) is composed as shown in FIG. 3, the second transistor T2 is not turned on during discharging operation by the discharging unit 304, and, thus, the second discharging path D2 is not generated. This leads to the line defects.

To the contrary, the n-th stage STG(n) of the shift register according to the present disclosure separately includes the reverse start transistor T8 to which the reverse start signal Vst_R is applied. In addition, the stage STG(n) includes the dummy transistor T2 for generating a second discharge path D2 during the discharging operation by the discharging unit 304. Thus, after outputting the gate signal GS(n) from the n-th stage STG(n), the charges charged in the Q node Q-node may be completely discharged.

In this way, the charges charged in the Q node of the n-th stage STG (n) in the display period are completely discharged in the discharge process. Thus, during the non-display period, the n-th gate signal GS(n) is not output from the n-th stage STG(n). Thus, the line defects may be suppressed during the non-display period as described above.

Figure 9:
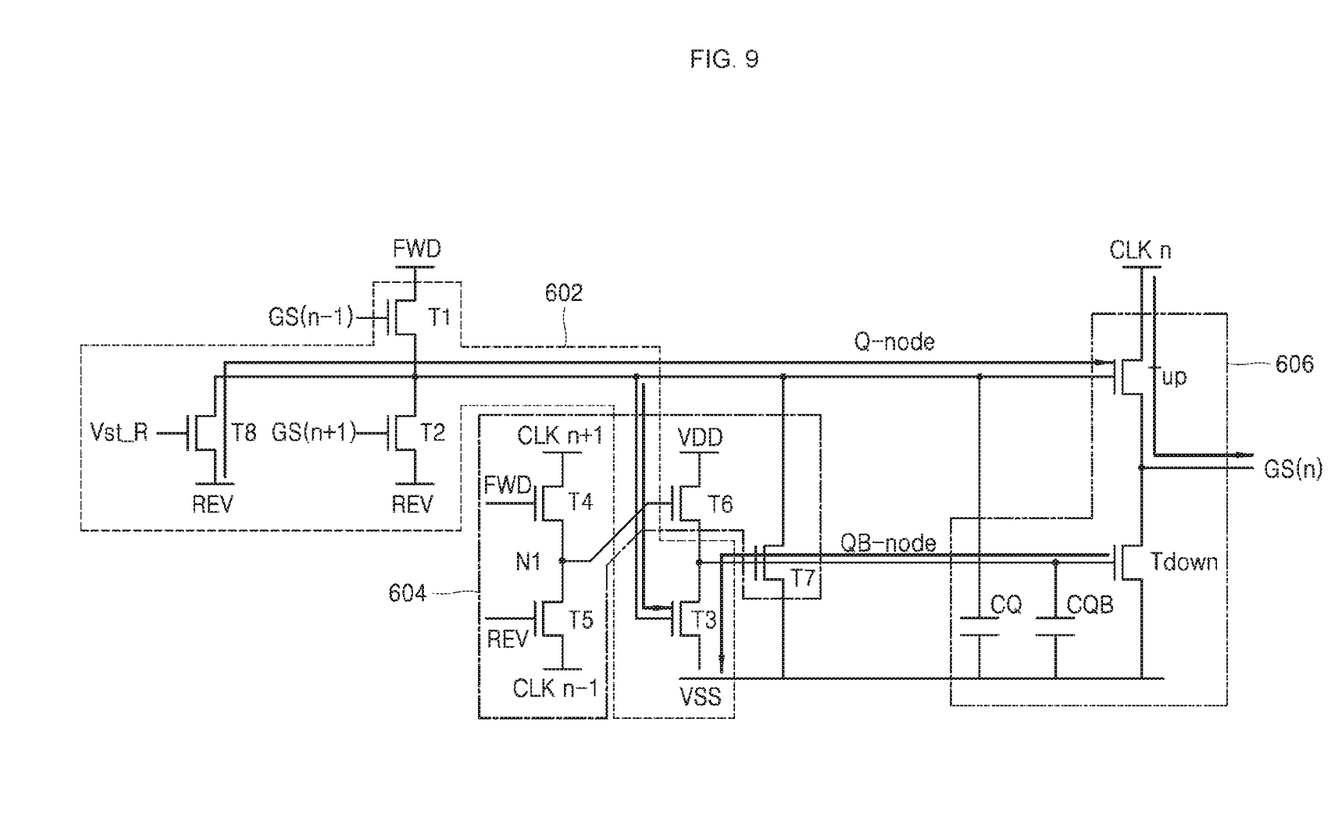
FIG. 9 shows a process for charging the Q node in the n-th stage in a reverse operation of a shift register according to one embodiment of the present disclosure.

FIG. 9 shows a process for charging the Q node in the n-th stage in a reverse operation of a shift register according to one embodiment of the present disclosure.

The reverse operation of n-th stage STG(n) as shown in FIG. 9 is basically similar to the reverse operation of the (n−1)-th stage STG(n−1) as shown in FIG. 3. However, the reverse start signal Vst_R for operating the n-th stage STG(n) in the reverse mode is input to the gate of a separate transistor, that is, the reverse start transistor T8 instead of the second transistor T2 as shown in FIG. 3.

When, in response to receiving the reverse start signal Vst_R, the reverse start transistor T8 is turned on, the reverse voltage REV is supplied to the Q node through the drain of the reverse start transistor T8. Then, the third transistor T3 is turned on by the reverse voltage REV supplied to the Q node. As the third transistor T3 is turned on, a current path from the QB node to the second DC drive voltage VSS is generated and, thus, the QB node is discharged.

Further, the reverse voltage REV supplied to the Q node is supplied to the gate of the pull-up transistor Tup included in the gate signal output unit 306. At this time, when the n-th clock signal CLK n is supplied to the source of the pull-up transistor Tup, a potential of the Q node Q-node is boosted by the Q node capacitor CQ and becomes higher to the turn-on level. As a result, the pull-up transistor Tup is turned on, and, thus, the n-th clock signal CLK n is output as the n-th gate signal GS(n).

Although not shown in the FIG., the process of discharging the charges charged in the Q-node after the output of the n-th gate signal GS(n) is similar to the process described with reference to FIG. 8. However, in the reverse operation of the n-th stage STG(n), the dummy transistor T2 is not turned on. Rather, the first transistor T1 is turned on by the (n−1)-th gate signal GS(n−1). In this way, the second discharge path D2 is generated by the first transistor T1.

The shift register according to the present disclosure separately includes the dummy transistor T2 for discharging the charges charged in the Q node in the forward operation, and the reverse start transistor T8 which is turned on by the reverse start signal Vst_R in the reverse operation. Thus, the present disclosure solves the line defect problem that has otherwise occurred in the prior art in the non-display period while ensuring the forward operation and reverse operation of the shift register.

The present disclosure is intended to cover various modifications and equivalent arrangements of the present disclosure to those skilled in the art to which the present disclosure pertains without departing from the technical idea of the present disclosure. Thus, the present disclosure is not limited to the above-described embodiments, and the accompanying drawings.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A shift register, the register including n stages, each being configured for performing forward and reverse operations, wherein in the forward operation, a gate signal is output in a forward direction, wherein in the reverse operation, the gate signal is output in a reverse direction, wherein a n-th stage among the n stages includes:
 a charging unit configured for charging a Q node in a response to a reception of a forward start signal or a reverse start signal;
 a gate signal output unit configured for outputting the gate signal in a response to the Q node being charged by the charging unit;
 a discharging unit configured for discharging the Q node after the output unit has outputted the gate signal, the discharging unit including a fourth transistor, a fifth transistor, a sixth transistor, and a seventh transistor;
 a dummy transistor within the charging unit, the dummy transistor being coupled to the Q node; and
 a reverse start transistor coupled to the Q node,
 wherein the fourth transistor and the fifth transistor are connected in series,
 wherein a gate of the sixth transistor is connected to a joint node of the fourth transistor and the fifth transistor,
 wherein a gate of the seventh transistor is connected to a drain of the sixth transistor, and a source of the seventh transistor is connected to the Q node,
 wherein the fourth transistor, the sixth transistor, the seventh transistor, and the dummy transistor are turned on after the gate signal has been outputted by the output unit in the forward operation so that a voltage charged in the Q node is discharged through the seventh transistor and the dummy transistor, and
 wherein the dummy transistor is turned on by a dummy carry signal output from a timing control unit.

2. The shift register of claim 1, wherein the reverse start transistor is turned on by the reverse start signal in the reverse operation.

3. The shift register of claim 1, wherein the dummy transistor is turned on only in the forward operation, and wherein the reverse start transistor is turned on only in the reverse operation.

4. A display device comprising:
 a display panel having a plurality of pixels;
 a gate drive unit configured for supplying a gate signal to a plurality of gate lines arranged in the display panel;
 a data drive unit configured for supplying a data signal to a plurality of data lines arranged in the display panel;
 a timing control unit configured for controlling the gate drive unit and the data drive unit; and
 a shift register in the gate drive unit, the register including n stages, each being configured for performing forward and reverse operations,
 wherein in the forward operation, the gate signal is output in a forward direction,
 wherein in the reverse operation, the gate signal is output in a reverse direction,
 wherein a n-th stage among the n stages includes:
 a charging unit configured for charging a Q node in a response to a reception of a forward start signal or a reverse start signal;
 a gate signal output unit configured for outputting the gate signal in a response to the Q node being charged by the charging unit; and
 a discharging unit configured for discharging the Q node after the output unit has outputted the gate signal, the discharging unit including a fourth transistor, a fifth transistor, a sixth transistor, and a seventh transistor,
 a dummy transistor within the charging unit, the dummy transistor being coupled to the Q node; and
 a reverse start transistor coupled to the Q node,
 wherein the fourth transistor and the fifth transistor are connected in series,
 wherein a gate of the sixth transistor is connected to a joint node of the fourth transistor and the fifth transistor,
 wherein a gate of the seventh transistor is connected to a drain of the sixth transistor and a source of the seventh transistor is connected to the Q node,
 wherein the fourth transistor, the sixth transistor, the seventh transistor, and the dummy transistor are turned on after the gate signal has been outputted by the output unit in the forward operation so that a voltage charged in the Q node is discharged through the seventh transistor and the dummy transistor, and
 wherein the dummy transistor is turned on by a dummy carry signal output from the timing control unit.

5. The display device of claim 4, wherein the reverse start transistor is turned on by the reverse start signal in the reverse operation.

6. The display device of claim 4, wherein the dummy transistor is turned on only in the forward operation, and wherein the reverse start transistor is turned on only in the reverse operation.

7. A method comprising:
 outputting gate drive signals from n-stages of a shift register, each stage having an output node that is charged based on a charge status of a Q node;
 driving the shift register in a forward direction to transfer each respective gate signal from a first stage to a subsequent forward stage;
 driving the shift register in a reverse direction to transfer each respective gate signal from a last stage to a subsequent backward stage; and
 discharging the Q node of at least one stage of the shift register after the gate signal has been outputted by the stage when the shift register is operating in the forward direction,
 wherein the discharging the Q node is carried out by:
 turning on a fourth transistor, a sixth transistor, a seventh transistor, and a dummy transistor so that a voltage charged in the Q node is discharged through the seventh transistor and the dummy transistor, and
 wherein the dummy transistor is turned on by a dummy carry signal output from a timing control unit.

8. The method according to claim 7, further including:
 fully discharging all current charged in at least some before a non-display period begins.

9. The method according to claim 8, further including:
 turning on the dummy transistor only when the shift register is operating in the forward direction.

10. The method according to claim 7, further including:
 turning on a reverse start transistor when the shift register is operated in the reverse direction.

11. The method of claim 7, in which the dummy transistor is turned on only when the shift register is operated in the forward direction.

12. The method of claim 7, in which a reverse start transistor is turned on only when the shift register is operated in the reverse direction.

13. The method of claim 7, wherein:
when the shift register is operated in the forward direction, it sequentially outputs gate signals in the order from a stage STG(1) to a stage STG(n).

14. The method of claim 7, wherein:
when the shift register is operated in the reverse direction, it sequentially outputs gate signals in the order from a stage STG(n) to a stage STG(1).

* * * * *